(12) United States Patent
Kim et al.

(10) Patent No.: US 11,367,685 B2
(45) Date of Patent: Jun. 21, 2022

(54) ELECTRONIC DEVICE AND METHOD FOR FABRICATING THE SAME

(71) Applicant: SK hynix Inc., Icheon (KR)

(72) Inventors: Seong-Hyun Kim, Suwon (KR); Jung-Won Seo, Suwon (KR); An-Na Choi, Seoul (KR)

(73) Assignee: SK hynix Inc., Icheon (KR)

( * ) Notice: Subject to any disclaimer, the term of this patent is extended or adjusted under 35 U.S.C. 154(b) by 86 days.

(21) Appl. No.: 16/808,295

(22) Filed: Mar. 3, 2020

(65) Prior Publication Data

US 2021/0074640 A1  Mar. 11, 2021

(30) Foreign Application Priority Data

Sep. 11, 2019 (KR) .................. 10-2019-0112790

(51) Int. Cl.
| | |
|---|---|
| *H01L 23/532* | (2006.01) |
| *H01L 27/24* | (2006.01) |
| *H01L 21/768* | (2006.01) |
| *H01L 23/522* | (2006.01) |
| *H01L 45/00* | (2006.01) |
| *H01L 27/11568* | (2017.01) |
| *H01L 21/764* | (2006.01) |

(52) U.S. Cl.
CPC ...... *H01L 23/5329* (2013.01); *H01L 21/7682* (2013.01); *H01L 23/5226* (2013.01); *H01L 27/2481* (2013.01); *H01L 21/764* (2013.01); *H01L 27/11568* (2013.01); *H01L 45/06* (2013.01); *H01L 45/08* (2013.01); *H01L 45/126* (2013.01)

(58) Field of Classification Search
CPC ............. H01L 23/5329; H01L 27/2481; H01L 21/7682; H01L 23/5226; H01L 45/06; H01L 27/2409; H01L 27/2427; H01L 27/2463; H01L 45/1233; H01L 45/1675; H01L 23/5386; H01L 45/14; H01L 21/31053; H01L 21/764; H01L 27/11568; H01L 45/08; H01L 45/126; G06F 12/0831; G06F 3/0656; G06F 3/0658; G06F 3/0679

See application file for complete search history.

(56) References Cited

U.S. PATENT DOCUMENTS

2020/0052038 A1\* 2/2020 Kim .................. H01L 45/06

FOREIGN PATENT DOCUMENTS

| KR | 101148693 B1 | 2/2010 | |
|---|---|---|---|
| KR | 101148693 B1 \* | 5/2012 | ......... H01L 45/1233 |
| KR | 1020180050824 A | 5/2018 | |
| KR | 1020190001419 A | 1/2019 | |

\* cited by examiner

*Primary Examiner* — Patricia D Valenzuela

(57) ABSTRACT

An electronic device including a semiconductor memory is provided. The semiconductor memory includes: a plurality of lower lines disposed over a substrate and extending in a first direction; a plurality of upper lines disposed over the lower lines and extending in a second direction crossing the first direction; a plurality of memory cells disposed between the lower lines and the upper lines and overlapping intersection regions of the lower lines and the upper lines; and an air gap located between the upper lines and extending in the second direction.

18 Claims, 15 Drawing Sheets

ELECTRONIC DEVICE AND METHOD FOR FABRICATING THE SAME

CROSS-REFERENCE TO RELATED APPLICATIONS

The present application claims priority of Korean Patent Application No. 10-2019-0112790, filed on Sep. 11, 2019, which is incorporated herein by reference in its entirety.

TECHNICAL FIELD

This patent document relates to memory circuits and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various implementations of an electronic device capable of achieving high integration and reducing process difficulty while securing characteristics of memory cells, and a method for fabricating the same.

In an implementation, an electronic device includes a semiconductor memory, which includes: a plurality of lower lines disposed over a substrate and extending in a first direction; a plurality of upper lines disposed over the lower lines and extending in a second direction crossing the first direction; a plurality of memory cells disposed between the lower lines and the upper lines and overlapping intersection regions of the lower lines and the upper lines; and an air gap located between the upper lines and extending in the second direction.

In another implementation, an electronic device includes a semiconductor memory, which includes: a plurality of stacked structures stacked over a substrate, wherein a first stacked structure of the plurality of stacked structures comprises: a plurality of first lower lines extending in a first direction; a plurality of first upper lines formed over the first lower lines and extending in a second direction crossing the first direction; a plurality of first memory cells disposed between the first lower lines and the first upper lines at intersection regions of the first lower lines and the first upper lines; and a first air gap located between the first upper lines and extending in the second direction, and a second stacked structure comprising: a plurality of second lower lines extending in the second direction; a plurality of second upper lines formed over the second lower lines and extending in the first direction; a plurality of second memory cells disposed between the second lower lines and the second upper lines and overlapping intersection regions of the second lower lines and the second upper lines; and a second air gap located between the second upper lines and extending in the first direction.

In another implementation, a method for fabricating an electronic device comprising a semiconductor memory, includes: forming a first conductive layer and a memory material layer over a substrate; etching the first conductive layer and the material layer using a first mask pattern having a line shape extending in a first direction to form lower lines and memory material patterns extending in the first direction; forming a second conductive layer over the memory material patterns; etching the second conductive layer and the memory material patterns using a second mask pattern having a line shape extending in a second direction crossing the first direction to form upper lines extending in the second direction and pillar shaped memory cells; forming an insulating layer between the memory cells and the upper lines; and forming an air gap within the insulating layer, the air gap being located between the upper lines and extending in the second direction.

These and other aspects, implementations and associated advantages are described in greater detail in the drawings, the description and the claims.

DETAILED DESCRIPTION

Figure 1A:
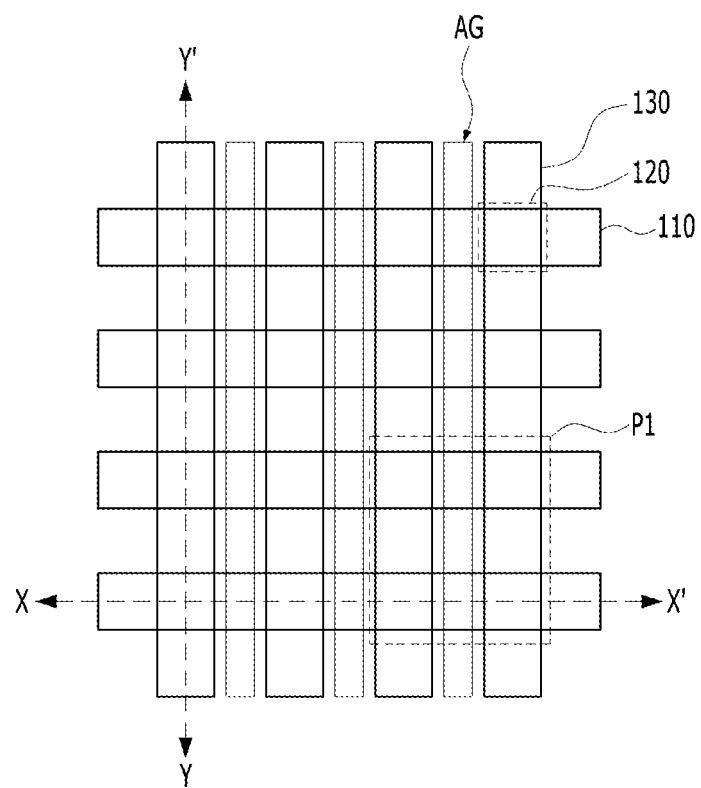
FIGS. 1A to 1D are views illustrating a semiconductor memory according to an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
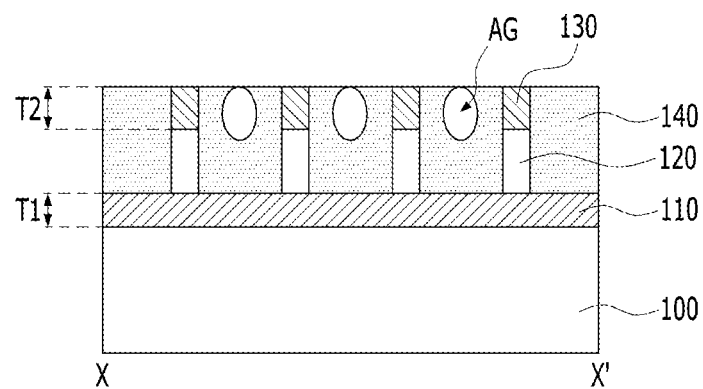
Figure 1C:
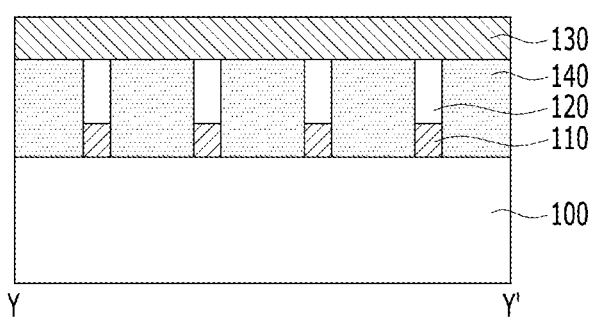
Figure 1D:
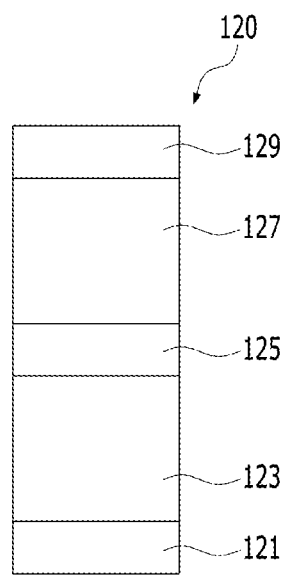

FIGS. 1A to 1D are views illustrating a semiconductor memory according to an implementation of the present disclosure. FIG. 1A is a planar view. FIG. 1B is a cross-sectional view taken along a line X-X' of FIG. 1A. FIG. 1C is a cross-sectional view taken along a line Y-Y' of FIG. 1A. FIG. 1D shows an example of a memory cell of FIGS. 1A to 1C.

Referring to FIGS. 1A to 1C, a memory device of the present implementation may include a substrate 100, a plurality of lower lines 110, a plurality of upper lines 130, a plurality of memory cells 120 and an insulating layer 140 having air gaps AG. The lower lines 110 may be disposed over the substrate 100 and extend in a first direction parallel to the line X-X'. The upper lines 130 may be disposed over the lower lines 110 and extend in a second direction parallel to the line Y-Y'. The memory cells 120 may be disposed between the lower lines 110 and the upper lines 130 and overlap intersection regions of the lower lines 110 and the upper lines 130. Here, intersection regions are areas where the lower lines 110 cross the upper lines 130 from a plan view perspective, e.g. the area inside the dashed line used to illustrate memory cell 120 in FIG. 1A. The insulating layer 140 may fill spaces between the lower lines 110, between the upper lines 130 and between the memory cells 120. The air gaps AG may be formed within the insulating layer 140. Each of the air gaps AG may be located between two adjacent upper lines 130.

The substrate 100 may include a lower structure (not shown) that may include for example, transistors for controlling the lower lines 110 and/or the upper lines 130.

The lower lines 110 may extend in the first direction and be spaced apart from each other in the second direction. The lower lines 110 may include a conductive material such as a metal, a metal nitride, or the like. A thickness of the lower line 110 is shown by reference character T1 in FIG. 1B.

The upper lines 130 may be spaced apart from the lower lines 110 in a vertical direction. The upper lines 130 may extend in the second direction and be spaced apart from each other in the first direction. The upper lines 130 may include a conductive material such as a metal, a metal nitride, or the like. A thickness of the upper line 130 is shown by reference character T2 in FIG. 1B.

In an embodiment, the thickness T2 of the upper line 130 may be greater than the thickness T1 of the lower line 110. As will be described later, due to nature of an etching process for patterning the upper line 130 and the lower line 110, the upper line 130 may have a relatively small width and the lower line 110 may have a relatively large width. In this case, if the upper line 130 and the lower line 110 have the same thickness, a problem in which sheet resistance of the upper line 130 is relatively large may occur. In order to solve this problem, the sheet resistance of the upper line 130 may be reduced by making the thickness T2 of the upper line 130 larger than the thickness T1 of the lower line 110.

As an example, the lower line 110 may function as a word line and the upper line 130 may function as a bit line. However, as another example, the lower line 110 may function as a bit line and the upper line 130 may function as a word line.

Each of the memory cells 120 may store data and have a multi-layered structure.

As an example, as shown in FIG. 1D, the memory cell 120 may include a lower electrode layer 121, a selection element layer 123, an intermediate electrode layer 125, a memory layer 127, and an upper electrode layer 129 which are sequentially stacked. However, the layer structure of the memory cell 120 may be modified. For example, the positions of the selection element layer 123 and the memory layer 127 may be reversed. Alternatively, although not shown, the memory cell 120 may further include one or more layers that improve characteristics of the memory cell 120 in addition to the above layers 121 to 129. Alternatively, at least one of the lower electrode layer 121, the intermediate electrode layer 125 and the upper electrode layer 129 may be omitted.

The lower electrode layer 121 may be positioned at the lowermost portion of the memory cell 120 and function as a passage for transferring current or voltage supplied from the lower line 110. The selection element layer 123 may control access to the memory layer 127. The intermediate electrode layer 125 may electrically connect selection element layer 123 and the memory layer 127 while physically separating them. The memory layer 127 may store different data. The upper electrode layer 129 may be positioned at the uppermost portion of the memory cell 120 to be a passage for transferring current or voltage supplied from the upper line 130.

The selection element layer 123 may substantially block a current flow when a level of an applied voltage or current is equal to or lower than a certain threshold value, and allow a current flow that sharply increases in proportion to a magnitude of the applied voltage or current when the level of the applied voltage or current is higher than the certain threshold value. The selection element layer 123 may use a Metal-Insulator-Transition (MIT) device such as $NbO_2$ or $TiO_2$, a Mixed Ion-Electron Conducting (MIEC) device such as $ZrO_2(Y_2O_3)$, $Bi_2O_3$—$BaO$, or $(La_2O_3)x(CeO_2)1-x$, an Ovonic Threshold Switching (OTS) device including a chalcogenide-based material such as $Ge_2Sb_2Te_5$, $As_2Te_3$, $As_2$ or $As_2Se_3$, or a tunneling insulating layer that is formed of a thin film including various insulating materials, e.g., a silicon oxide, a silicon nitride, a metal oxide and so forth, and allows tunneling of electrons under a condition of a certain voltage or current. The selection element layer 123 may have a single-layered structure, or a multi-layered structure that has selection element characteristics with a combination of two or more layers.

The memory layer 127 may store different data in various ways. As an example, the memory layer 127 may include a variable resistance layer which switches between different resistance states according to an applied voltage or current. The variable resistance layer may include a material used in an RRAM, a PRAM, an FRAM or an MRAM, for example, a metal oxide such as a transition metal oxide or a perovskite-based material, a phase-change material such as a chalcogenide-based material, a ferroelectric material, a ferromagnetic material and the like. The variable resistance layer may have a single-layered structure, or a multi-layered structure that shows a variable resistance characteristic with a combination of more than two layers. As an example, the variable resistance layer may include a phase change material which switches between a crystalline state and an amorphous state by Joule heat generated according to a current flowing therethrough. When the phase change material is in a crystalline state, the phase change material may have a low resistance state, and when the phase change material is in an amorphous state, the phase change material may have a high resistance state.

The lower electrode layer 121, the intermediate electrode layer 125, and the upper electrode layer 129 may have a single-layered structure or a multi-layered structure including various conductive materials such as a metal, a metal nitride, a carbon, or the like.

Referring again to FIGS. 1A to 1C, the insulating layer 140 may include a silicon oxide, a low-k material having a lower dielectric constant than silicon oxide, a combination of low-k material and silicon oxide, or the like.

In the insulating layer 140, the air gap AG may be formed between the upper lines 130 and have a line shape extending in the second direction. The air gap AG may be filled with air or be in a vacuum. Effects and/or reasons for forming the air gap AG may be as follows.

Heat may be generated when operating memory cells 120. For example, when the memory cell 120 includes a phase change material, heat may be generated for program and erase operations of memory cells 120. When reading data stored in the memory cell 120, it is possible for heat associated with the read operation to cause a read disturbance in which a phase change material of a low resistance state, that is, a crystalline state, is changed to a high resistance state, that is, an amorphous state. Reducing the amount of capacitance of structures near the memory cell 120 may reduce the read disturbance. In the present implementation, the capacitance between the upper lines 130 may be reduced by forming the air gap AG between the upper lines 130.

A thickness of the air gap AG in the vertical direction may be equal to or less than the thickness T2 of the upper line 130. In particular, a lower surface of the air gap AG may be disposed at a height greater than or equal to an upper surface of the memory cell 120. When the lower surface of the air gap AG extends below the upper surface of the memory cell 120, forming the air gap AG may compromise the integrity of the memory cell 120 during the manufacturing process of the memory device, as will be described in more detail in the following description of the manufacturing method of FIGS. 2A to 2J.

In addition, although the cross-section of the air gap AG is illustrated as having an oval shape in FIG. 1B, the present disclosure is not limited thereto, and the air gap AG may have other shapes in other embodiments.

At least a portion of the air gap AG may be in contact with the insulating layer 140. Accordingly, the insulating layer 140 surrounding the air gap AG and the air gap AG may both be disposed between the upper lines 130. In this case, if the insulating layer 140 includes a low-k material, capacitance between the upper lines 130 may be further reduced.

Meanwhile, even when the air gap AG is positioned between the lower lines 110, capacitance of nearby the memory cell 120 may be reduced. However, if the air gap AG is present between the lower lines 110, excessive etching may occur in the etching process for forming the memory cells 120, thereby attacking a lower structure, for example, the substrate 100. Furthermore, as demonstrated by the experimental data in Table 1, capacitance may be further reduced when the air gap AG is formed between the upper lines 130, compared to an embodiment in which the air gap AG is only formed between the lower lines 110. Therefore, it may be desirable to form the air gap AG between the upper lines 130.

FIGS. 2A to 2J are views illustrating a method for fabricating a semiconductor memory according to an implementation of the present disclosure. FIGS. 2A to 2J are illustrated based on a cross-section taken along lines X-X' and Y-Y' of a portion P1 of FIG. 1A.

Figure 2A:
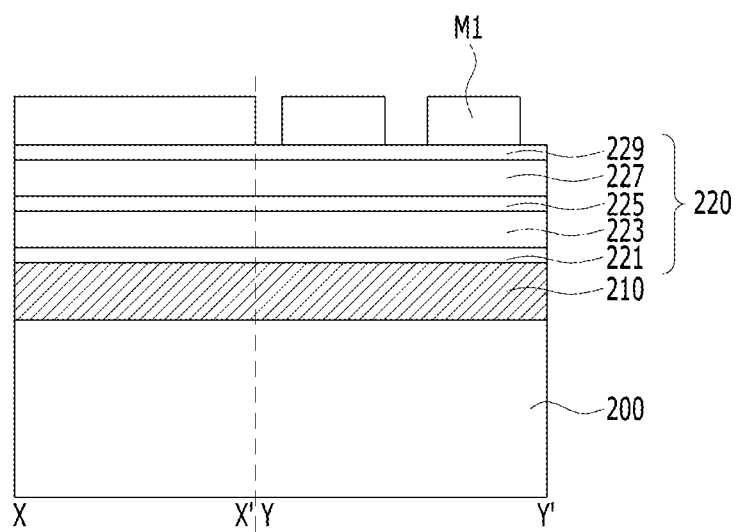
FIGS. 2A to 2J are views illustrating a method for fabricating a semiconductor memory according to an implementation of the present disclosure.

Referring to FIG. 2A, a conductive layer 210 for forming lower lines and multilayer structures 220 for forming memory cells may be formed over a substrate 200. The multilayer structures 220 may include a lower electrode conductive layer 221, a selection element material layer 223, an intermediate electrode conductive layer 225, a memory material layer 227, and an upper electrode conductive layer 229.

Subsequently, a first mask pattern M1 having a line shape extending in the first direction may be formed over the multilayer structures 220.

Figure 2B:
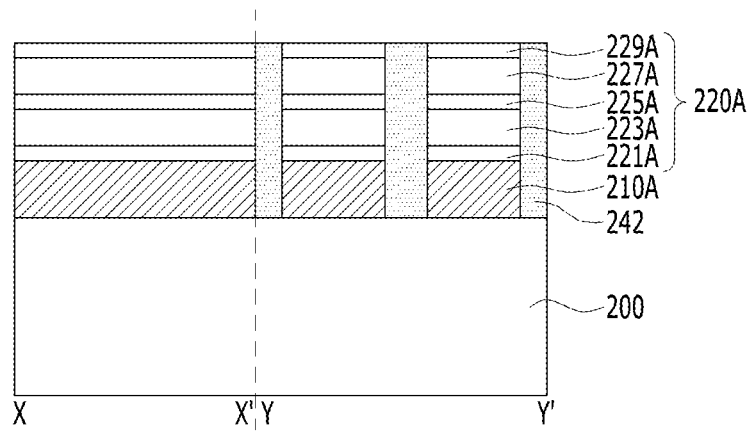

Referring to FIG. 2B, lower lines 210A and multilayer patterns 220A may be formed by etching the multilayer structures 220 and the conductive layer 210 using the first mask pattern M1 as an etching barrier.

The lower lines 210A may be spaced apart from each other in the second direction while extending in the first direction.

Each of the multilayer patterns 220A may include a lower electrode conductive layer pattern 221A, a selection element material layer pattern 223A, an intermediate electrode conductive layer pattern 225A, a memory material layer pattern 227A, and an upper electrode conductive layer pattern 229A. In addition, the multilayer patterns 220A may overlap the lower lines 210A, respectively, and have a line shape extending in the first direction.

As described above, this etching process may be performed by an anisotropic etching process using an etching gas or the like. Accordingly, although not shown, the stacked structure of the lower line 210A and the multilayer pattern 220A may have a shape of which a width increases from top to bottom.

Subsequently, a first insulating layer 242 may be formed to fill spaces between the stacked structures of the lower line 210A and the multilayer pattern 220A. The first insulating layer 242 may include various insulating materials such as a silicon oxide, a low-k material, or a combination thereof.

The first mask pattern M1 may be removed in this etching process or by an additional removal process.

Figure 2C:
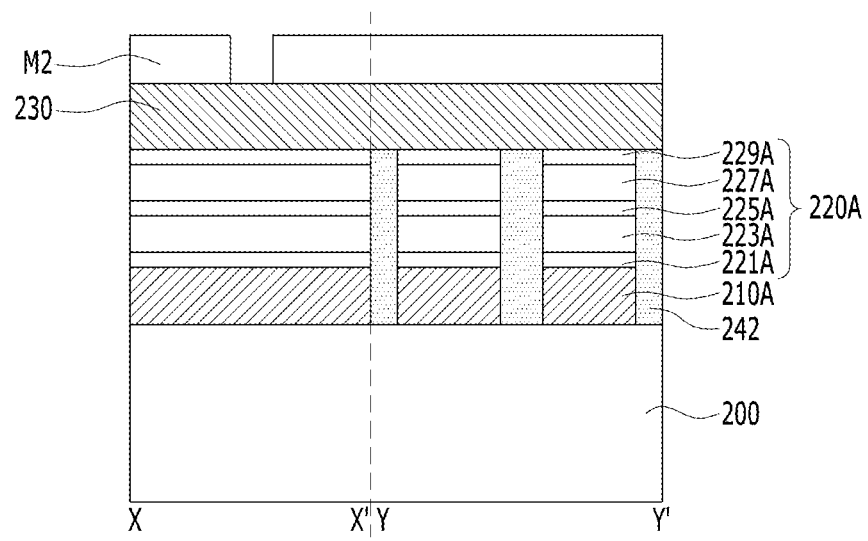

Referring to FIG. 2C, a conductive layer 230 for forming upper lines may be formed over the multilayer patterns 220A and the first insulating layer 242.

Subsequently, a second mask pattern M2 having a line shape extending in the second direction may be formed over the conductive layer 230.

Figure 2D:
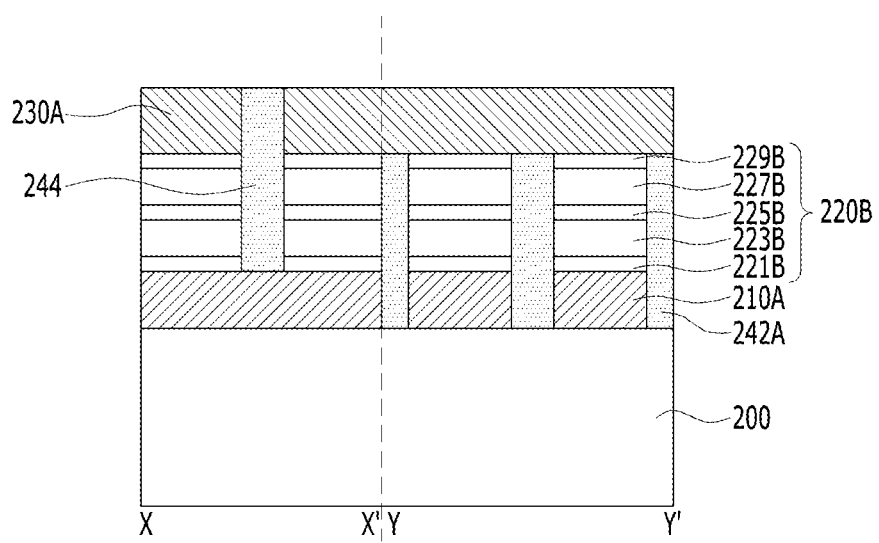

Referring to FIG. 2D, upper lines 230A and memory cells 220B may be formed by etching the conductive layer 230 and the multilayer patterns 220A using the second mask pattern M2 as an etching barrier.

The upper lines 230A may be arranged to be spaced apart from each other in the first direction while extending in the second direction.

The memory cell 220B may have a pillar shape overlapping the lower line 210A and the upper line 230A. Both sidewalls of the memory cell 220B in the first direction may be aligned with both sidewalls of the upper line 230A, and both sidewalls of the memory cell 220B in the second direction may be aligned with both sidewalls of the lower line 210A. The memory cell 220B may include a lower electrode layer 221B, a selection element layer 223B, an intermediate electrode layer 225B, a memory layer 227B, and an upper electrode layer 229B.

In this etching process, the first insulating layer 242 may also be etched together in a region not overlapping the second mask pattern M2, thereby forming a first insulating layer pattern 242A. The first insulating layer pattern 242A may be alternately arranged with the memory cells 220B along the second direction while having a pillar shape between the memory cells 220B.

As described above, this etching process may be an anisotropic etching process using an etching gas or the like. Accordingly, although not shown, the stacked structure of the memory cell 220B and the upper line 230A may have a shape in which a width in the first direction increases from the top to the bottom. As a result, even if the first mask pattern M1 and the second mask pattern M2 have the same line width, the width of the upper line 230A in the first direction may be smaller than the width of the lower line 210A in the second direction. In this case, in order to prevent an increase in sheet resistance of the upper line 230A, the thickness of the upper line 230A may be greater than the thickness of the lower line 210A.

Subsequently, a second insulating layer 244 may be formed to fill a space formed by etching the conductive layer 230, the multilayer patterns 220A, and the first insulating layer 242. The second insulating layer 244 may be disposed between the stacked structures of the memory cell 220B and the upper line 230A and between the stacked structures of the first insulating layer pattern 242A and the upper line 230A. The second insulating layer 244 may include various insulating materials such as a silicon oxide, a low-k material, or a combination thereof. An insulating spacer (not shown) may be further formed on sidewalls of the memory cell 220B and the upper line 230A before the formation of the second insulating layer 244.

The second mask pattern M2 may be removed in this etching process or by an additional removal process.

Figure 2E:
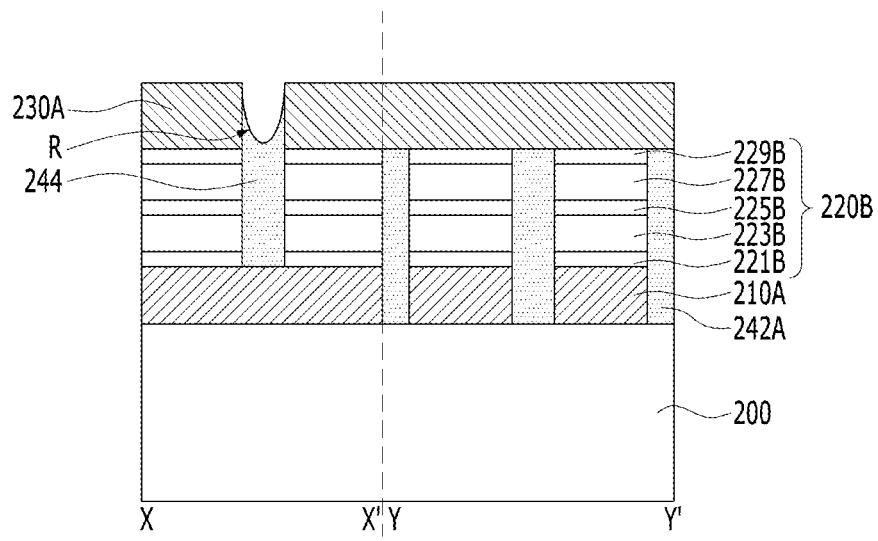

Referring to FIG. 2E, a portion of the second insulating layer 244 exposed by the upper line 230A may be removed to form a recess R having a predetermined depth in the second insulating layer 244.

Recess R may be formed by a wet etching method. In addition, the depth of the recess R may be controlled such that a lower surface of the recess R is located at a level higher than or equal to an upper surface of the memory cell 220B, for example, an upper surface of the upper electrode layer 229B. Accordingly, a sidewall of the memory cell 220B, particularly, a sidewall of the upper electrode layer 229B, may not be exposed when the recess R is formed. In this implementation, since the upper surface of the memory cell 220B contacts the lower surface of the upper line 230A, the lower surface of the recess R may be positioned at or above the same height as the lower surface of the upper line 230A. In another implementation, if there is an additional layer (not shown) between the upper line 230A and the memory cell 220B, the lower surface of recess R may be located at a height equal to or higher than the upper surface of the memory cell 220B and below the lower surface of the upper line 230A.

The recess R may have a line shape extending in a second direction between the upper lines 230A in the planar view. In addition, a width of the recess R may decrease from top to bottom in the cross-sectional view taken along the line X-X'. Accordingly, the lower surface of the recess R may have a shape in which an edge is relatively high and a center is relatively low in the cross-sectional view taken along the line X-X'.

Figure 2F:
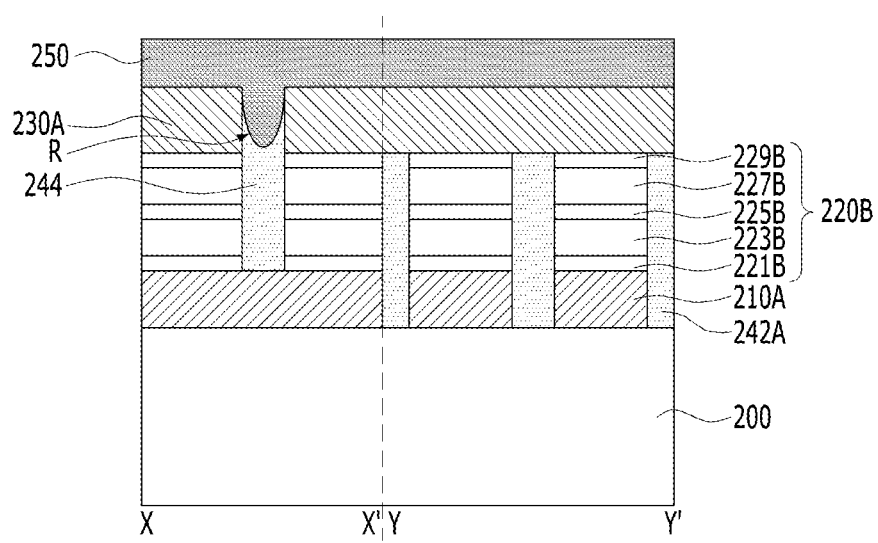

Referring to FIG. 2F, the sacrificial layer 250 may be formed over the resultant structure of FIG. 2E.

The sacrificial layer 250 may be formed to a thickness sufficiently to fill the recess R. In addition, the sacrificial layer 250 may be formed of a film that is easy to remove in a subsequent process, for example, a carbon-based film. As an example, the sacrificial layer 250 may be formed by coating a spin on carbon (SOC) layer.

Figure 2G:
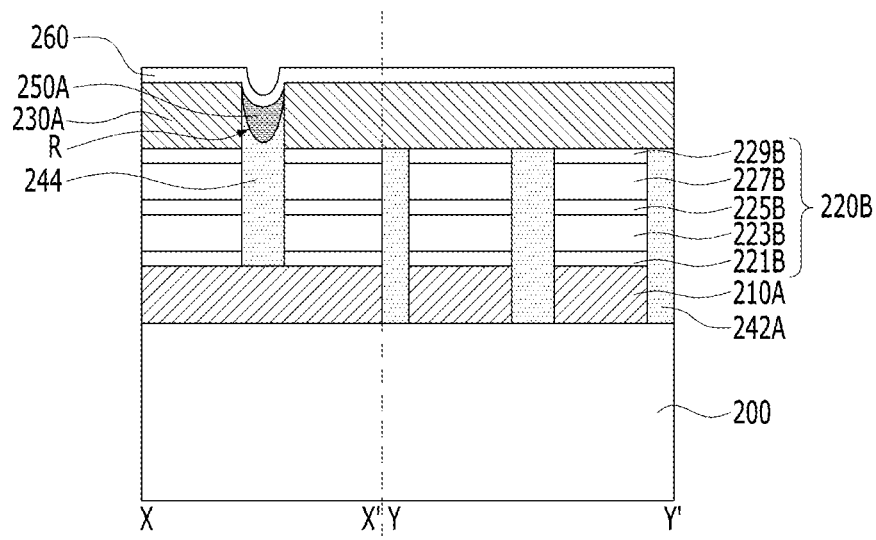

Referring to FIG. 2G, the sacrificial layer 250 on the upper line 230A may be removed to form a sacrificial layer pattern 250A that fills the recess R.

The removal of the sacrificial layer 250 may be performed by an etching back process so that the upper surface of the upper line 230A is exposed. In addition, the removal of the sacrificial layer 250 may be performed such that the upper surface of the sacrificial layer pattern 250A is lowered by a predetermined amount below the upper surface of the upper line 230A. This is to allow a passivation layer pattern (see 260A in FIG. 2J) described later to be in contact with a side structure, for example, a side surface of the upper line 230A. In the present implementation, the lower surface of the sacrificial layer pattern 250A may be substantially the same as the shape of the lower surface of the recess R. The upper surface of the sacrificial layer pattern 250A may have a shape where an edge is relatively high and a center is relatively low in the cross-sectional view taken along the line X-X', but the present disclosure is not limited thereto. In another implementation, the sacrificial layer pattern 250A may have a substantially flat upper surface.

Subsequently, the passivation layer 260 may be formed over the upper line 230A and the sacrificial layer pattern 250A.

The passivation layer 260 may serve to protect the upper line 230A and other similar structures during a subsequent process of removing the sacrificial layer pattern 250A and to maintain a space formed by the removal of the sacrificial layer pattern 250A. The passivation layer 260 may be formed of an insulating material and may have a low thickness through which gas or plasma can be passed to remove the sacrificial layer pattern 250A. For example, the passivation layer 260 may include an ultra-low temperature oxide (ULTO) layer. In this implementation, the passivation layer 260 may have an uneven upper surface that follows contours present in the lower structure. As a result, the portion of passivation layer 260 disposed over sacrificial layer pattern 250A may have a concave or recessed shape that reflects the recessed shape of sacrificial layer pattern 250A.

Figure 2H:
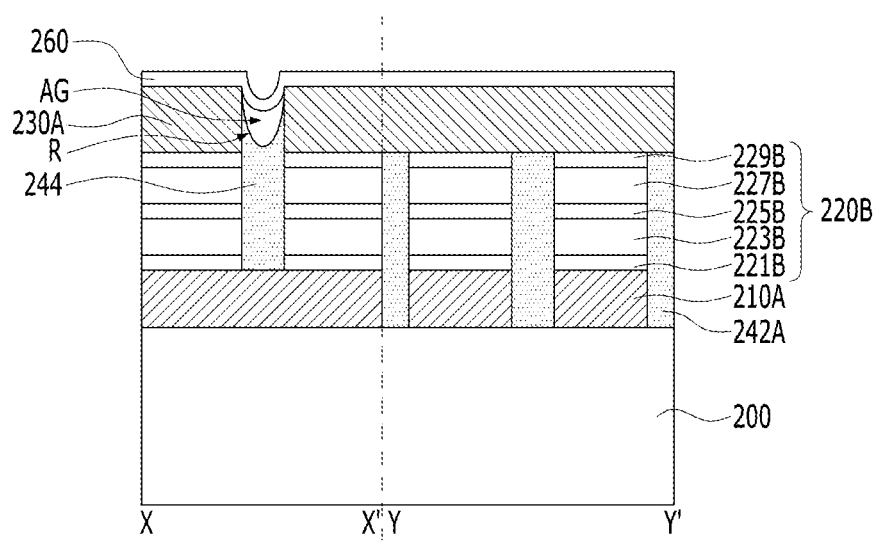

Referring to FIG. 2H, only the sacrificial layer pattern 250A may be removed while the passivation layer 260 is maintained. A space formed by removing the sacrificial layer pattern 250A may form an air gap AG.

The removal of the sacrificial layer pattern 250A may be performed by using a gas or plasma that passes through the passivation layer 260. When the sacrificial layer pattern 250A includes a carbon-based material such as SOC, the sacrificial layer pattern 250A may be removed by a process using an oxygen plasma, for example, a photoresist strip process. As described above, since the lower surface of the sacrificial layer pattern 250A is positioned at a height greater than or equal to the upper surface of the memory cell 220B, particularly, the upper surface of the upper electrode layer 229B, the sidewall of the upper electrode layer 229B may not be exposed. Accordingly, even if the upper electrode layer 229B and the sacrificial layer pattern 250A include the same carbon-based material, the upper electrode layer 229B may not be removed during this removal process of the sacrificial layer pattern 250A.

The air gap AG may be filled with air or be in a vacuum state. Like the recess R, the air gap AG may have a line shape extending in the first direction between the upper lines 230A in the planar view. In addition, the air gap AG may have a shape substantially the same as that of the sacrificial layer pattern 250A in the cross-sectional view taken along the line X-X'. That is, the lower surface of the air gap AG may have a recessed shape of which an edge is relatively high and a center is relatively low. Also, the upper surface of the air gap AG may have a recessed shape of which an edge is relatively high and a center is relatively low, but the upper surface of the air gap AG may be less recessed compared to the lower surface of the air gap AG. Put another way, the upper surface of air gap AG may have a concave shape having a first concavity, and the lower surface of air gap AG may have a concave shape with a second concavity that is greater than the first concavity. The lower surface of the air gap AG may be located at a height greater than or equal to the upper surface of the memory cell 220B.

By forming the air gap AG, capacitance between the upper lines 230A may be reduced. In addition, the second insulating layer 244 is present between the upper lines 230A except for the air gap AG. When the second insulating layer 244 includes a low-k material, the capacitance reduction effect may be further increased.

Figure 2I:
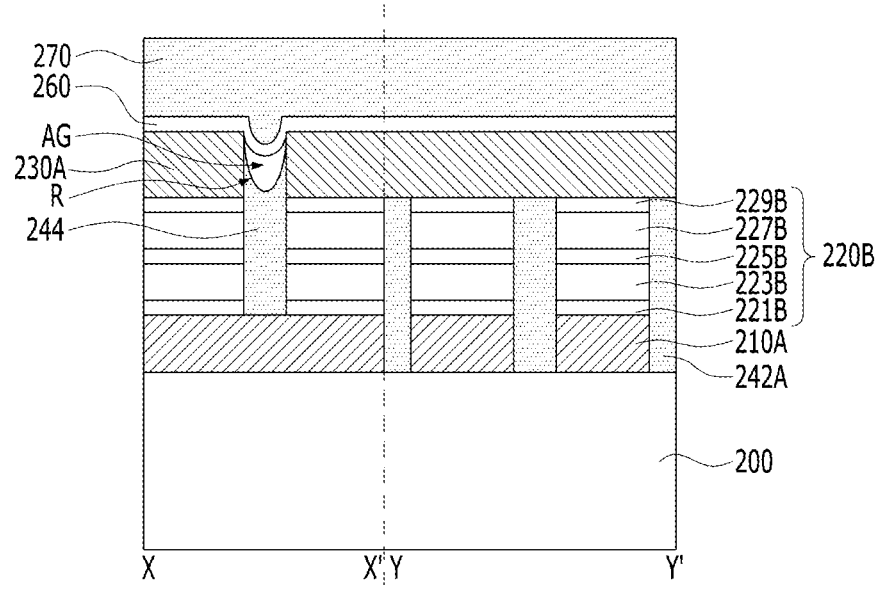

Referring to FIG. 2I, a third insulating layer 270 may be formed over the passivation layer 260.

Subsequent processes may benefit from having a substantially flat surface on which to deposit structures. Therefore, when the passivation layer 260 does not have a flat upper surface, e.g. due to a concavity disposed over air gap AG, a third insulating layer 270 may formed to provide a flat surface. The third insulating layer 270 may be formed to a thickness sufficient to fill the recessed portion of the passivation layer 260. For reference, when a stacked structure includes the lower lines 210A, the upper lines 230A, and the memory cells 220B therebetween, a plurality of stacked structures may be repeatedly formed in the vertical direction. In other words, a plurality of stacked structures may be stacked on top of one another to form a multilayer memory structure.

The third insulating layer 270 may include various insulating materials such as a silicon oxide, a low-k material, or a combination thereof. The third insulating layer 270 may be formed of substantially the same material as the first insulating layer 242 and/or the second insulating layer 244. When the third insulating layer 270 includes a low-k material, the capacitance between the upper lines 230A may be further reduced.

Figure 2J:
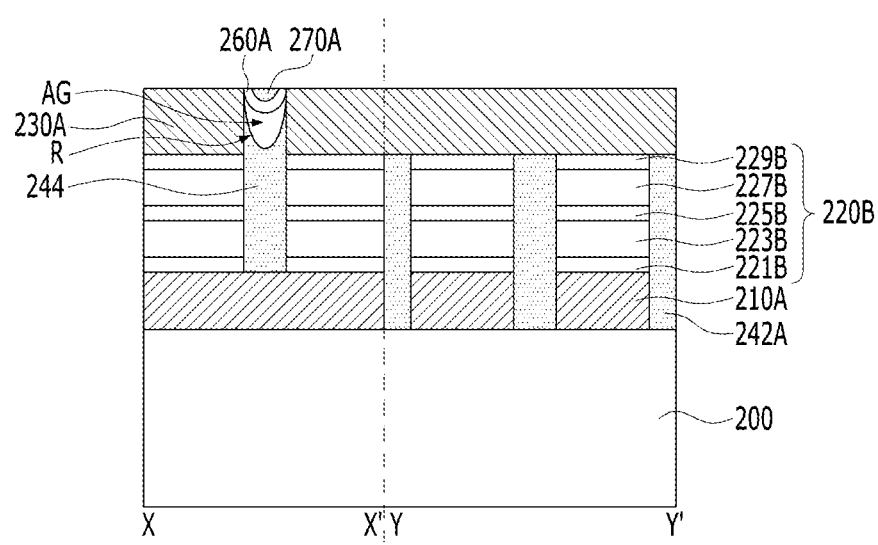

Referring to FIG. 2J, a planarization process, for example, a chemical mechanical polishing (CMP) process, may be performed until the upper surface of the upper line 230A is exposed. As a result, a passivation layer pattern 260A and a third insulating layer pattern 270A may be formed over the air gap AG.

The passivation layer pattern 260A may be formed to cover the air gap AG while being attached to and supported by a sidewall structure, for example, a sidewall of the upper line 230A or an insulating spacer (not shown) of the sidewall of the upper line 230A. The third insulating layer pattern 270A may be present over the passivation layer pattern 260A. A space located above the air gap AG may be filled with the passivation layer pattern 260A or the passivation layer pattern 260A and the third insulating layer pattern 270A. The upper surface of the passivation layer pattern 260A or the upper surfaces of the passivation layer pattern 260A and the third insulation layer pattern 270A may be positioned at the same height as the upper surface of the upper line 230A to form a flat surface.

Accordingly, the lower surface of the air gap AG may be surrounded by the second insulating layer 244, and the upper surface of the air gap AG may be covered by the passivation layer pattern 260A and the third insulating layer pattern 270A.

FIGS. 1A to 1C or FIG. 2J only show one stacked structure. However, a plurality of stacked structures may be repeatedly stacked in the vertical direction, thereby increasing the degree of integration of the memory device. However, adjacent stacked structures in the vertical direction may share an upper line or a lower line. For this reason, if a word line is located at a lower position and a bit line is located at a higher position in one stacked structure, a bit line may be located at a lower position and a word line may be located at a higher position in another stacked structure immediately above the lower stacked structure. In other words, adjacent stacked structures in the vertical direction may be mirrored to one another in the vertical dimension. An embodiment of such a structure will be described by way of example with reference to FIGS. 3A to 3C.

Figure 3A:
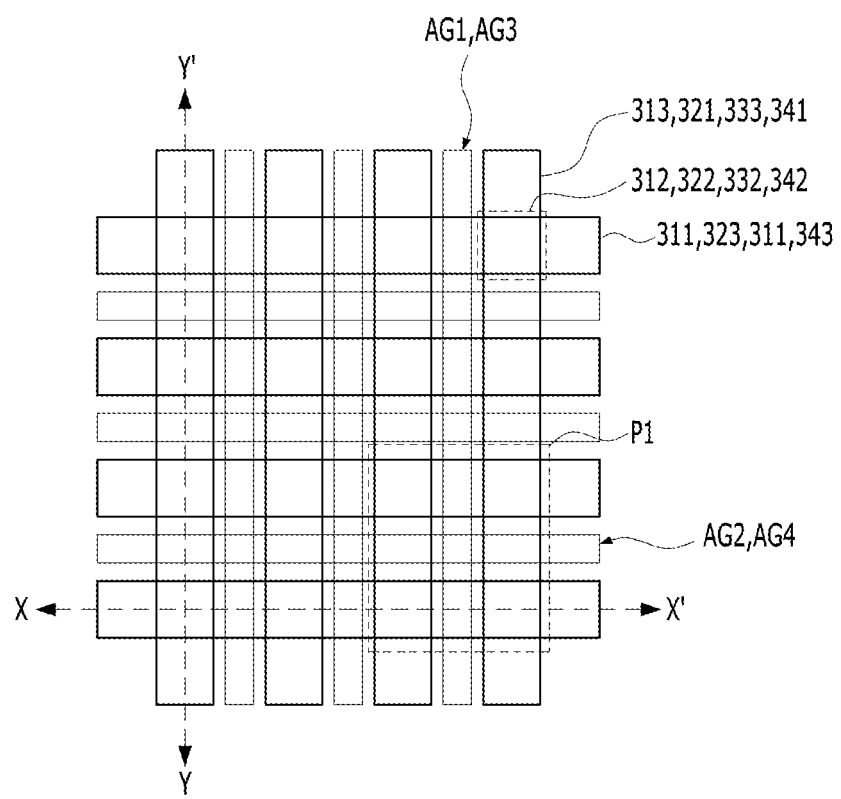
FIGS. 3A to 3C are views illustrating a semiconductor memory according to another implementation of the present disclosure.
Figure 3B:
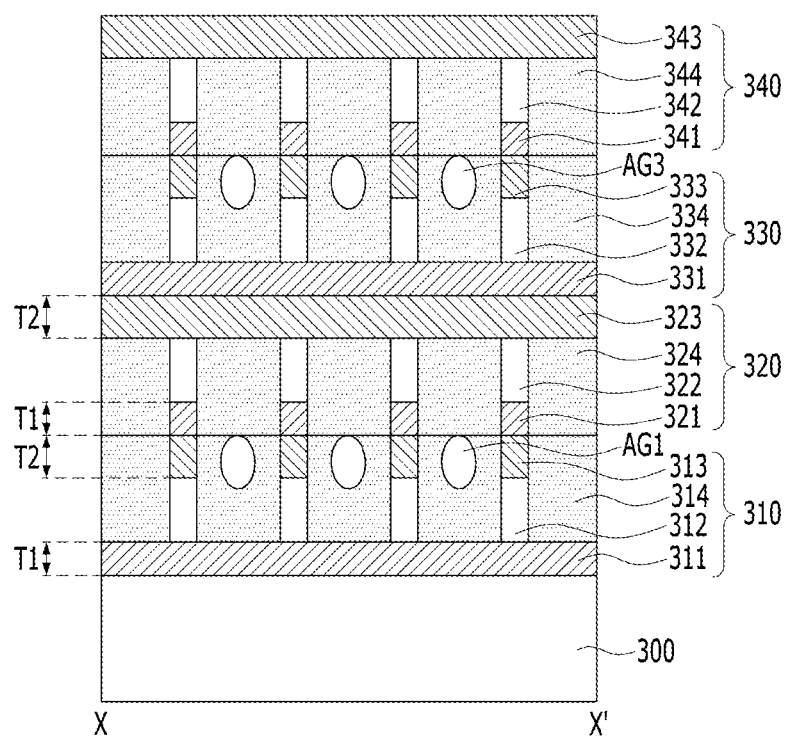
Figure 3C:
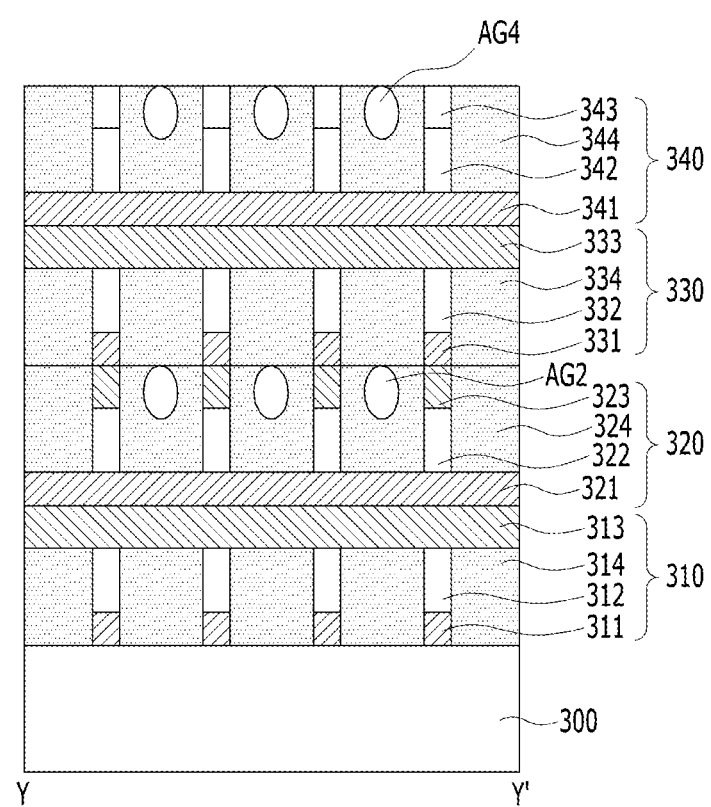

FIGS. 3A to 3C are views illustrating a semiconductor memory according to another implementation of the present disclosure. FIG. 3A is a planar view. FIG. 3B is a cross-sectional view taken along a line X-X' of FIG. 3A. FIG. 3C is a cross-sectional view taken along a line Y-Y' of FIG. 3A.

Referring to FIGS. 3A to 3C, a memory device of the present implementation may include a plurality of stacked structures 310, 320, 330 and 340 sequentially stacked over a substrate 300. In the present implementation, four stacked structures 310, 320, 330 and 340 are formed, but the number of stacked structures may be variously modified. For convenience of description, the plurality of stacked structures 310, 320, 330 and 340 may be referred to as a first stacked structure 310, a second stacked structure 320, a third stacked structure 330 and a fourth stacked structure 340 according to a distance from the substrate 300.

The first stacked structure 310 may include a plurality of first lower lines 311 disposed over the substrate 300 and extending in a first direction parallel to the line X-X', a plurality of first upper lines 313 disposed over the first lower lines 311 and extending in a second direction parallel to the line Y-Y', a plurality of first memory cells 312 disposed between the first lower lines 311 and the first upper lines 313 and overlapping intersection regions thereof, and a first interlayer insulating layer 314 filling spaces between first lower lines 311, between the first memory cells 312, and between the first upper lines 313 and having a first air gap AG1 located between the first upper lines 313.

The first stacked structure 310 may be substantially the same as the stacked structure of FIGS. 1A to 1C. Accordingly, the thickness T1 of the first lower line 311 may be smaller than the thickness T2 of the first upper line 313. The first air gap AG1 may have a line shape extending in the second direction, and a lower surface thereof may be positioned at a height greater than or equal to an upper surface of the first memory cell 312. The cross-sectional shape of the first air gap AG1 is shown as having an oval shape. However, in another implementation, the first air gap AG1 may have another shape, for example, a concave or crescent shape as shown in FIG. 2J. The first interlayer insulating layer 314 may include various insulating materials, and particularly, may include a low-k material.

The second stacked structure 320 may include a plurality of second lower lines 321 disposed over the first stacked structure 310 and extending in the second direction, a plurality of second upper lines 323 disposed over the second lower lines 321 and extending in the first direction, a plurality of second memory cells 322 disposed between the second lower lines 321 and the second upper lines 323 and overlapping intersection regions thereof, and a second interlayer insulating layer 324 filling spaces between the second lower lines 321, between the second memory cells 322, and between the second upper lines 323 and having a second air gap AG2 located between the second upper lines 323.

The second stacked structure 320 may share a line with the first stacked structure 310. For this reason, unlike the first stacked structure 310, the second lower line 321 disposed below the second memory cell 322 may extend in the second direction and the second upper line 323 disposed above the second memory cell 322 may extend in the first direction in the second stacked structure 320.

The manufacturing process of the second stacked structure 320 may be substantially the same as the manufacturing process of the first stacked structure 310, but lines extending in the second direction, that is, the second lower lines 321 may be patterned first, and lines extending in the first direction, that is, the second upper lines 323, may be patterned later. More specifically, after forming a conductive layer for lower lines and multilayer structures for memory cells, an etching process using the second mask pattern M2 of FIG. 2C instead of the first mask pattern M1 of FIG. 2A may be performed to form lower lines and multilayer patterns. Then, after forming a conductive layer for upper lines over the lower lines and the multilayer patterns, an etching process using the first mask pattern M1 of FIG. 2A may be performed to form upper lines and memory cells.

In the second stacked structure 320, the thickness of the second upper line 323 may be greater than the thickness of the second lower line 321. Since the same manufacturing process as the manufacturing process of the first stacked structure 310 is repeated (except for the direction of the mask pattern), the thickness of the second lower line 321 may be the same as the thickness of the first lower line 311, as indicated by the reference character T1. Also, the thickness of the second upper line 323 may be the same as the thickness of the first upper line 313, as indicated by the reference numeral T2.

Since the first upper line 313 and the second lower line 321 are in direct contact with each other, the first upper line 313 and the second lower line 321 may effectively function as the same line in operations of the memory device. If the first upper line 313 functions as a bit line, the second lower line 321 may function as a bit line, and if the first upper line 313 functions as a word line, the second lower line 321 may function as a word line. That is, the first stacked structure 310 and the second stacked structure 320 may share a word line or a bit line. However, the first air gap AG1 may be located between the first upper lines 313 while not being located between the second lower lines 321 in order to prevent defects as described above.

In addition, since the second air gap AG2 is disposed between the second upper lines 323 in the second stacked structure 320, the second air gap AG2 may have a line shape extending in the first direction. The lower surface of the second air gap AG2 may be located at a height greater than or equal to the upper surface of the second memory cell 322. The cross-sectional shape of the second air gap AG2 is illustrated as having a round shape. However, in another implementation, the second air gap AG2 may have another shape, for example, a shape as shown in FIG. 2J. The second interlayer insulating layer 324 may include various insulating materials, and particularly, may include a low-k material.

The third stacked structure 330 may include a plurality of third lower lines 331 disposed over the second stacked structure 320 and extending in the first direction, a plurality of third upper lines 333 disposed over the third lower lines 331 and extending in the second direction, a plurality of third memory cells 332 disposed between and overlapping intersection regions of the third lower lines 331 and the third upper lines 333, and a third interlayer insulating layer 334 filling spaces between the third lower lines 331, between the third memory cells 332, and between the third upper lines 333. A third air gap AG3 may be located between the third upper lines 333.

The third stacked structure 330 and the second stacked structure 320 may share a word line or a bit line. For this reason, the third stacked structure 300 may have substantially the same structure as the first stacked structure 310, so a detailed description will be omitted for the sake of brevity.

The fourth stacked structure 340 may include a plurality of fourth lower lines 341 disposed over the third stacked structure 330 and extending in the second direction, a plurality of fourth upper lines 343 disposed over the fourth lower lines 341 and extending in the first direction, a plurality of fourth memory cells 342 disposed between and overlapping intersection regions of the fourth lower lines 341 and the fourth upper lines 343, and a fourth interlayer insulating layer 344 filling spaces between the fourth lower lines 341, between the fourth memory cells 342, and between the fourth upper lines 343. A fourth air gap AG4 may be located between the fourth upper lines 343.

The fourth stacked structure 340 and the third stacked structure 330 may share a word line or a bit line. For this reason, the fourth stacked structure 340 may have substantially the same structure as the second stacked structure 320, and detailed description will be omitted for the sake of brevity.

In this manner, odd-numbered stacked structures among a plurality of stacked structures stacked in the vertical direction may have the same structure, and even-numbered stacked structures may have the same structure. Bit lines or word lines of stacked structures that are adjacent to each other in the vertical direction may be in contact with each other, so that they share a conductive path. An upper line of a lower stacked structure and a lower line of an upper stacked structure adjacent to the lower stacked structure in the vertical direction may extend in the same direction.

The reduced capacitance effect of air gaps formed between upper lines of stacked structures as shown in FIGS. 3A to 3C has been confirmed experimentally as shown in the table below.

Table 1 shows capacitance values measured in five different cases. Each of the cases includes a stack of four stacked structures that are stacked on top of one another as seen in FIGS. 3A-3C, and capacitance using a certain insulation material was measured. In case 1, silicon oxide is used for an interlayer insulating layer between upper lines of each of the stacked structures and between lower lines of each of the stacked structures and there is no air gap. In case 2, a low-k material is used for an interlayer insulating layer between upper lines of each of the stacked structures and between lower lines of each of the stacked structures and there is no air gap. In case 3, a low-k material is used for an interlayer insulating layer between upper lines of each of the stacked structures and between lower lines of each of the stacked structures and air gaps are present between the lower lines of each of the stacked structures. In case 4, a low-k material is used for an interlayer insulating layer between upper lines of each of the stacked structures and between lower lines of each of the stacked structures and air gaps are formed between the upper lines of each of the stacked structures. In case 5, a low-k material is used for an interlayer insulating layer between upper lines of each of the stacked structures and between lower lines of each of the stacked structures and air gaps are formed between the upper lines of each of the stacked structures and between the lower lines of each of the stacked structures. The capacitance values in femto-farads of these structures are shown in the bottom row of Table 1.

TABLE 1

| case 1 | case 2 | case 3 | case 4 | case 5 |
|---|---|---|---|---|
| silicon oxide | low-k material | low-k material & air gaps between lower lines | low-k material & air gaps between upper lines | low-k material & air gaps between upper lines and between lower lines |
| 53.7 | 47.0 | 44.0 (18.0% ↓) | 39.8 (25.8% ↓) | 36.8 (31.4% ↓) |

Table 1 shows that capacitance is decreased by both the air gaps and the low-k material.

In particular, the capacitance of case 4 in which air gaps are present between upper lines is less than the capacitance in case 3, in which air gaps are present between the lower lines.

If the process can be precisely controlled to prevent process defects, a lowest level of capacitance may be achieved when air gaps are present both between the lower lines and between the upper lines as in case 5.

However, if the process is difficult to control precisely, the air gaps may be formed only between the upper lines as in case 4, so that the process defect can be prevented while still achieving a certain amount of capacitance reduction.

In summary, according to a memory device of the present implementation and a method for manufacturing the same, by placing an air gap between upper lines in a stacked structure which includes lower lines and memory cells disposed at intersections of the upper and lower lines, process defects can be prevented and external capacitance can be reduced to prevent data writes caused by read operations. In addition, it is possible to increase a degree of integration of a semiconductor device by stacking a plurality of stacked structures in a vertical direction. Even if a plurality of stacked structures are stacked in a vertical direction, according to the present implementation, there is an advantage in that capacitance can be reduced without increasing process difficulty.

The above and other memory circuits or semiconductor devices based on the disclosed technology can be used in a range of devices or systems. FIGS. 4-8 provide some examples of devices or systems that can implement the memory circuits disclosed herein.

Figure 4:
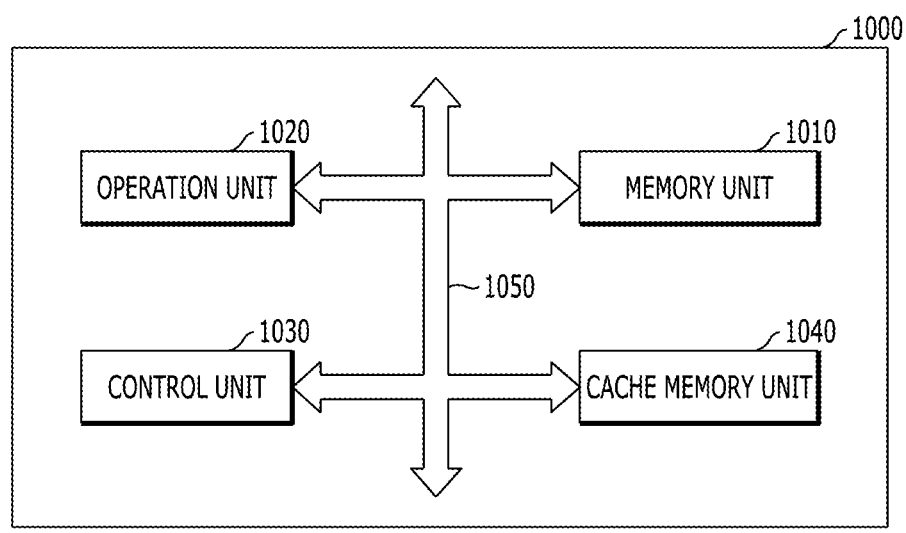
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of lower lines disposed over a substrate and extending in a first direction; a plurality of upper lines disposed over the lower lines and extending in a second direction crossing the first direction; a plurality of memory cells disposed between the lower lines and the upper lines and overlapping intersection regions of the lower lines and the upper lines; and an air gap located between the upper lines and extending in the second direction. Through this, in the memory unit 101, degree of integration may be increased, and data storage characteristics may be improved. As a consequence, it is possible to reduce a size and improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
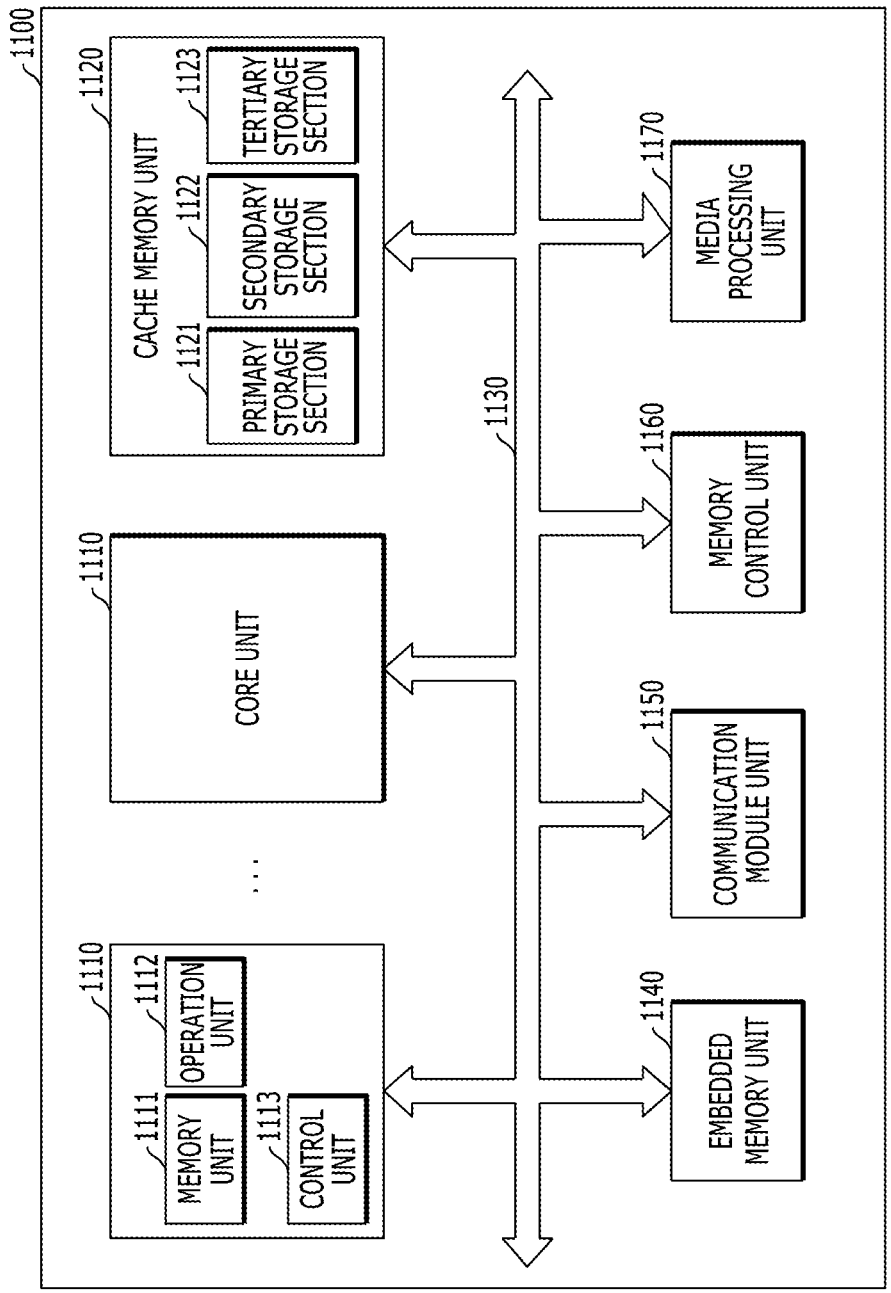
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of lower lines disposed over a substrate and extending in a first direction; a plurality of upper lines disposed over the lower lines and extending in a second direction crossing the first direction; a plurality of memory cells disposed between the lower lines and the upper lines and overlapping intersection regions of the lower lines and the upper lines; and an air gap located between the upper lines and extending in the second direction. Through this, degree of integration may be increased, and data storage characteristics may be improved in the cache memory unit 1120. As a consequence, it is possible to reduce a size and improve operating characteristics of the processor 1100.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
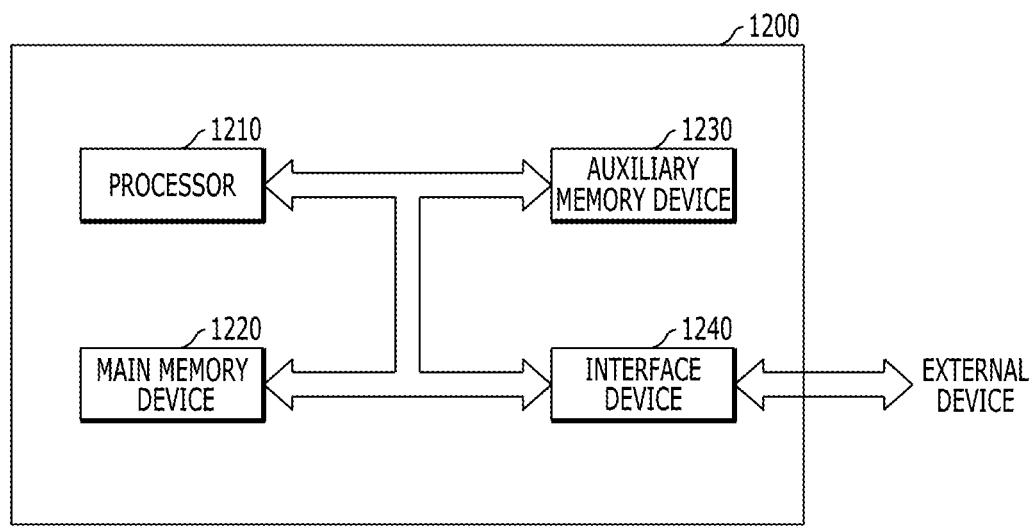
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of lower lines disposed over a substrate and extending in a first direction; a plurality of upper lines disposed over the lower lines and extending in a second direction crossing the first direction; a plurality of memory cells disposed between the lower lines and the upper lines and overlapping intersection regions of the lower lines and the upper lines; and an air gap located between the upper lines and extending in the second direction. Through this, degree of integration may be increased, and data storage characteristics may be improved in the main memory device 1220. As a consequence, it is possible to reduce a size and improve operating characteristics of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of lower lines disposed over a substrate and extending in a first direction; a plurality of upper lines disposed over the lower lines and extending in a second direction crossing the first direction; a plurality of memory cells disposed between the lower lines and the upper lines and overlapping intersection regions of the lower lines and the upper lines; and an air gap located between the upper lines and extending in the second direction. Through this, degree of integration may be increased, and data storage characteristics may be improved in the auxiliary memory device 1230. As a consequence, it is possible to reduce a size and improve operating characteristics of the system 1200.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
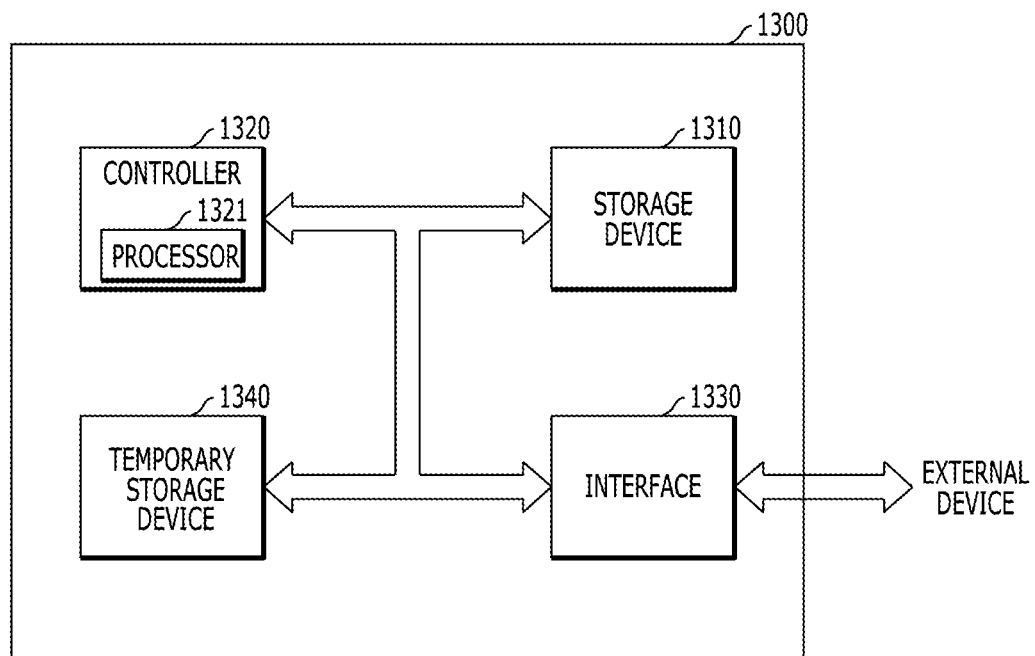
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of lower lines disposed over a substrate and extending in a first direction; a plurality of upper lines disposed over the lower lines and extending in a second direction crossing the first direction; a plurality of memory cells disposed between the lower lines and the upper lines and overlapping intersection regions of the lower lines and the upper lines; and an air gap located between the upper lines and extending in the second direction. Through this, degree of integration may be increased, and data storage characteristics may be improved in the temporary storage device. As a consequence, it is possible to reduce a size and improve operating characteristics of the data storage system.

Figure 8:
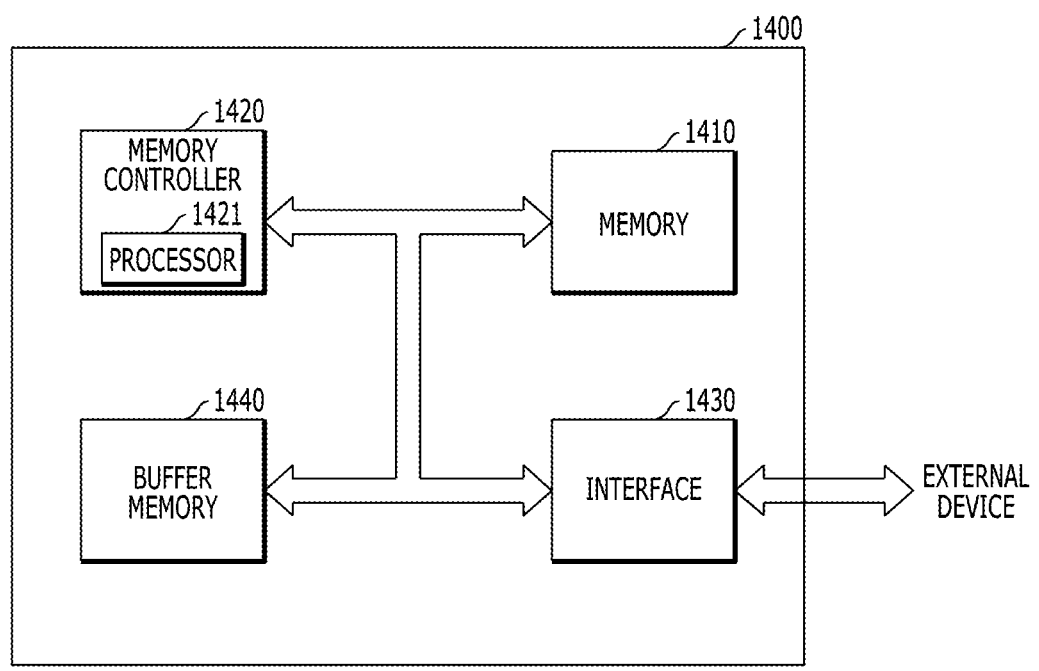
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of lower lines disposed over a substrate and extending in a first direction; a plurality of upper lines disposed over the lower lines and extending in a second direction crossing the first direction; a plurality of memory cells disposed between the lower lines and the upper lines and overlapping intersection regions of the lower lines and the upper lines; and an air gap located between the upper lines and extending in the second direction. Through this, degree of integration may be increased, and data storage characteristics may be improved in the memory 1410. As a consequence, it is possible to reduce a size and improve operating characteristics of the memory system.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of lower lines disposed over a substrate and extending in a first direction; a plurality of upper lines disposed over the lower lines and extending in a second direction crossing the first direction; a plurality of memory cells disposed between the lower lines and the upper lines and overlapping intersection regions of the lower lines and the upper lines; and an air gap located between the upper lines and extending in the second direction. Through this, degree of integration may be increased, and data storage characteristics may be improved in the buffer memory 1440. As a consequence, it is possible to reduce a size and improve operating characteristics of the memory system 1400.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, the semiconductor memory comprising:
    a plurality of lower lines disposed over a substrate and extending in a first direction;
    a plurality of upper lines disposed over the lower lines and extending in a second direction crossing the first direction;
    a plurality of memory cells disposed between the lower lines and the upper lines and overlapping intersection regions of the lower lines and the upper lines; and
    an air gap located between the upper lines and extending in the second direction,
    wherein a lower surface of the air gap is located at a height equal to or greater than upper surfaces of the plurality of memory cells.

2. The electronic device according to claim 1, wherein the air gap is surrounded by an insulating material located between the upper lines.

3. The electronic device according to claim 2, wherein the insulating material includes a low-k material.

4. The electronic device according to claim 1, wherein a thickness of the air gap is equal to or less than a thickness of the upper line.

5. The electronic device according to claim 1, wherein a thickness of the upper line is greater than a thickness of the lower line.

6. The electronic device according to claim 1, wherein the lower surface of the air gap has a recessed shape of which an edge adjacent to the upper line is higher than a center, and an upper surface of the air gap is less recessed than the lower surface of the air gap.

7. The electronic device according to claim 6, wherein the upper surface of the air gap is lower than an upper surface of the upper line.

8. The electronic device according to claim 7, wherein the semiconductor memory further comprises:
　a first insulating layer disposed under the lower surface of the air gap; and
　a second insulting layer disposed over the upper surface of the air gap.

9. The electronic device according to claim 8, wherein the second insulating layer includes two layers, and
　a first layer of the two layers includes a material different from the first insulating layer, and a second layer of the two layers includes the same material as the first insulating layer.

10. The electronic device according to claim 8, wherein the second insulating layer has an upper surface coplanar with the upper surface of the upper line.

11. The electronic device according to claim 1, wherein the memory cell includes a phase change material.

12. An electronic device comprising a semiconductor memory, the semiconductor memory including a plurality of stacked structures stacked over a substrate, wherein a first stacked structure of the plurality of stacked structures comprises:
　a plurality of first lower lines extending in a first direction;
　a plurality of first upper lines formed over the first lower lines and extending in a second direction crossing the first direction;
　a plurality of first memory cells disposed between the first lower lines and the first upper lines and overlapping intersection regions of the first lower lines and the first upper lines; and
　a first air gap located between the first upper lines and extending in the second direction, and
　a second stacked structure comprising:
　a plurality of second lower lines extending in the second direction;
　a plurality of second upper lines formed over the second lower lines and extending in the first direction;
　a plurality of second memory cells disposed between the second lower lines and the second upper lines and overlapping intersection regions of the second lower lines and the second upper lines; and
　a second air gap located between the second upper lines and extending in the first direction,
　wherein a lower surface of the first air gap is located at a height equal to or greater than an upper surface of at least one of the first memory cells, and
　a lower surface of the second air gap is located at a height equal to or greater than an upper surface of at least one of the second memory cells.

13. The electronic device according to claim 12, wherein an upper surface of the first air gap is located at a height equal to or less than a lower surface of the second lower line.

14. The electronic device according to claim 12, wherein the first air gap and the second air gap are surrounded by an insulating material.

15. The electronic device according to claim 14, wherein the insulating material includes a low-k material.

16. The electronic device according to claim 12, wherein a thickness of the first upper line is greater than a thickness of the first lower line, and
　a thickness of the second upper line is greater than a thickness of the second lower line.

17. The electronic device according to claim 16, wherein the thickness of the first upper line is equal to the thickness of the second upper line, and
　the thickness of the first lower line is equal to the thickness of the second lower line.

18. The electronic device according to claim 12, wherein the first upper line is in direct contact with the second lower line.

* * * * *